(12) United States Patent
Nishi et al.

(10) Patent No.: US 8,796,145 B2
(45) Date of Patent: Aug. 5, 2014

(54) METHOD OF MANUFACTURING METAL-BASE SUBSTRATE AND METHOD OF MANUFACTURING CIRCUIT BOARD

(75) Inventors: Taiki Nishi, Shibukawa (JP); Takeshi Miyakawa, Shibukawa (JP); Katsunori Yashima, Shibukawa (JP); Kensuke Okoshi, Shibukawa (JP); Hidenori Ishikura, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/696,890

(22) PCT Filed: Apr. 6, 2011

(86) PCT No.: PCT/JP2011/058735
§ 371 (c)(1),
(2), (4) Date: Nov. 8, 2012

(87) PCT Pub. No.: WO2011/142198
PCT Pub. Date: Nov. 17, 2011

(65) Prior Publication Data
US 2013/0056439 A1    Mar. 7, 2013

(30) Foreign Application Priority Data
May 10, 2010    (JP) .................................. 2010-108051

(51) Int. Cl.
*H01L 21/302* (2006.01)
*H01L 21/461* (2006.01)
*H05K 3/02* (2006.01)
*H05K 1/05* (2006.01)

(52) U.S. Cl.
CPC ........ *H05K 1/056* (2013.01); *H05K 2201/0209* (2013.01); *H05K 2201/0358* (2013.01); *H05K 3/022* (2013.01); *H05K 2203/1545* (2013.01)
USPC ........... 438/689; 438/458; 438/129; 174/258; 174/250; 174/260

(58) Field of Classification Search
USPC ............... 136/244, 252, 256; 156/252, 303.1, 156/89.12; 174/250, 255, 260; 206/725; 216/13; 257/59, 678, 706; 313/498; 347/59; 362/247, 249.02; 427/2.24, 427/96.2; 428/209, 426, 432, 450, 469, 428/473, 515; 429/456; 438/129, 34, 458; 525/71; 700/114
See application file for complete search history.

(56) References Cited

U.S. PATENT DOCUMENTS 4,853,277 A * 8/1989 Chant ........................... 428/209
(Continued)

FOREIGN PATENT DOCUMENTS

JP    08-083963    3/1996
(Continued)

OTHER PUBLICATIONS

English translation of JP 08-323918.*
(Continued)

*Primary Examiner* — Duy Deo
*Assistant Examiner* — Erin Bergner
(74) *Attorney, Agent, or Firm* — Robert Mlotkowski Safran & Cole P.C.

(57) ABSTRACT

A method of manufacturing a metal-base substrate having an insulative adhesive layer and a conductor layer on a metal-based material is provided. The method includes the steps of dispersing a disperse phase in an insulative adhesive-dispersing medium that contains a wetting dispersant and constitutes the insulative adhesive layer; laminating step of laminating the insulative adhesive on the conductor foil as feeding the roll-shaped conductor foil; curing the insulative adhesive on the conductor foil under heat into a B stage state and thus forming a composite of the conductor foil and the insulative adhesive layer in the B stage state; laminating the metal-based material on the insulative adhesive layer in the B stage state to give a laminate; and then curing the insulative adhesive layer in the B stage state into a C stage state by heat pressurization of the laminate.

10 Claims, 5 Drawing Sheets

(56) References Cited

U.S. PATENT DOCUMENTS

| | | | |
|---|---|---|---|
| 5,761,801 A * | 6/1998 | Gebhardt et al. | 29/846 |
| 2007/0292697 A1 | 12/2007 | Nakayoshi et al. | |

FOREIGN PATENT DOCUMENTS

| | | |
|---|---|---|
| JP | 8-288646 A | 11/1996 |
| JP | 08-323916 A | 12/1996 |
| JP | 08-323918 A | 12/1996 |
| JP | 10-242635 A | 9/1998 |
| JP | 2002-322372 A | 11/2002 |
| JP | 2004-134781 A | 4/2004 |
| JP | 2005-268405 A | 9/2005 |
| JP | 59-36999 A | 3/2009 |
| JP | 2009-049062 A | 3/2009 |

OTHER PUBLICATIONS

International Search Report PCT/JP2011/058735 mailed on May 24, 2011.

* cited by examiner

METHOD OF MANUFACTURING METAL-BASE SUBSTRATE AND METHOD OF MANUFACTURING CIRCUIT BOARD

TECHNICAL FIELD

The present invention relates to a method of manufacturing a metal-base substrate and a method of manufacturing a circuit board using the metal-base substrate produced by the method. More specifically, it relates to a method of manufacturing a metal-base substrate for mounting heat-generating electronic parts such as Light Emitting Diodes (LEDs) and a method of manufacturing a circuit board.

BACKGROUND ART

Recently along with increase in density, integration, output and others of electronic parts such as semiconductor elements, measures to the heat released from these electronic parts are becoming more important and there is thus increasing interest on metal-base substrates superior in heat dissipation efficiency. In particular, since LEDs, which are used in illumination application, generate much heat, metal-based circuit boards have been used for LEDs for improvement in reliability and life. Thus, there is a need for methods for efficiently manufacturing a metal-base substrate and a circuit board, which are superior in quality and inexpensive.

Hitherto proposed was a method of manufacturing a metal-based circuit board by forming an insulating layer of crosslinked transparent silicone by coating a crosslinkable silicone on a metal base of aluminum or an aluminum alloy and forming a circuit directly thereon (see, for example, Patent Document 1). Also proposed was a method of manufacturing a metal-based circuit board by laminating and integrating an adhesion sheet of an insulative resin and an inorganic filler and additionally a metal foil on a metal board in that order (see, for example, Patent Document 2).

CITATION LIST

Patent Documents

[Patent Document 1] Japanese Unexamined Patent Application Publication No. 2005-268405
[Patent Document 2] Japanese Unexamined Patent Application Publication No. 2009-49062

SUMMARY OF INVENTION

Technical Problem

However, conventional methods of manufacturing a metal-based circuit board described above had problems below: the methods for coating a resin composition, which constitutes an insulating layer, on a metal base, such as that described in Patent Document 1, have a problem of difficulty in continuous roll coating and thus low productivity, when the thickness of the metal base is large.

Alternatively, the production method described in Patent Document 2 permits stabilized production in simple and convenient steps but, since the metal board, adhesion sheet and metal foil, which are all leaf-shaped sheets, are lower in handling efficiency, the method is disadvantageous from the point of productivity. In addition, traditional production methods had a problem that, if an inorganic filler is added to a resin composition constituting the insulating layer (insulative adhesive) in a great amount for improvement of heat dissipation efficiency, there were many voids remaining in the insulative adhesive layer after curing, leading to decrease in withstand voltage and heat dissipation efficiency.

Accordingly, a main object of the present invention is to provide a method of manufacturing a high-quality and high-heat-dissipation metal-base substrate for mounting heat-generating electronic parts that contains no void remaining in the insulative adhesive layer and a method of manufacturing a circuit board.

Solution to Problem

The method of manufacturing a metal-base substrate according to the present invention is a method of manufacturing a metal-base substrate having an insulative adhesive layer and a conductor layer laminated in that order on a metal-based material, comprising: a dispersing step of dispersing a disperse phase in an insulative adhesive-dispersing medium that contains a wetting dispersant and constitutes the insulative adhesive layer; a laminating step of laminating the insulative adhesive on the conductor foil as feeding the roll-shaped conductor foil; a first curing step of curing the insulative adhesive on the conductor foil under heat into the B stage state and thus forming a composite of the conductor foil and the insulative adhesive layer in the B stage state; a metal-based material-laminating step of laminating the metal-based material on the insulative adhesive layer in the B stage state and thus forming a laminate; and a second curing step of curing the insulative adhesive layer in the B stage state into the C stage state by heat pressurization of the laminate under the condition of 70 to 260° C. and 0.1 to 10 MPa.

The method of manufacturing a metal-base substrate may comprise additionally a sheet-cutting step of cutting the composite after the first curing step or the laminate after the metal-based material-laminating step into sheet-shaped articles.

In addition, the insulative adhesive may contain an epoxy resin and an inorganic filler.

Further in the composite obtained in the first curing step, the insulative adhesive layer in the B stage state may have a reaction-starting temperature of 60 to 250° C.

Furthermore in the laminate obtained in the second curing step, the insulative adhesive layer in the C stage state may have a thermal conductivity of 1.0 to 15.0 W/(m·K).

The method of manufacturing a metal-based circuit board according to the present invention comprises a patterning step of forming a conductor pattern on the conductor foil of the board produced by the method of manufacturing a metal-base substrate described above and a film-forming step of forming an organic insulative film on the conductor pattern.

The term "B stage state," as used in the present invention, is a semi-cured state of the insulative adhesive, in which the insulative adhesive is solid at normal temperature (25° C.) and fuses again when heated at high temperature (60° C. or higher), and quantitatively, it means a state with a curing rate of 5 to 80%.

Alternatively, the "C stage state" is a state, in which the insulative adhesive is insoluble and infusible after almost completion of the curing reaction of the adhesive, and quantitatively, it means a state with a curing rate of 80% or more.

Advantageous Effects of Invention

It is possible according to the present invention to efficiently produce a high-quality and high-heat-dissipation metal-base substrate and a metal-based circuit board that are used for mounting heat-generating electronic parts and contain no void remaining in the insulative adhesive layer.

DESCRIPTION OF EMBODIMENTS

Hereinafter, favorable embodiments of the present invention will be described in detail with reference to attached drawings. However, it should be understood that the present invention is not limited to the embodiments described below.

First Embodiment

Figure 1:
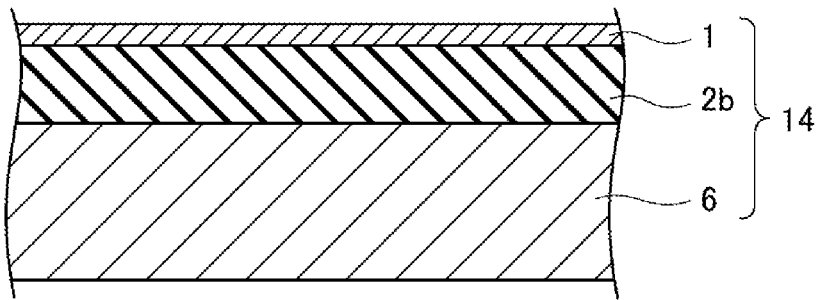
FIG. 1 is a schematic cross-sectional view illustrating the configuration of a metal-base substrate according to the first embodiment of the present invention.

A method of manufacturing a metal-base substrate according to a first embodiment of the present invention will be described first. FIG. 1 is a schematic cross-sectional view illustrating the configuration of the metal-base substrate in the present embodiment. As shown in FIG. 1, the metal-base substrate 14 in the present embodiment has an insulative adhesive layer 2b in the C stage state formed on a metal-based material 6 and a conductor foil 1 formed thereon.

[Metal-Based Material 6]

The material for the metal-based material 6 is not particularly limited, but preferably aluminum, iron, copper, stainless steel or an alloy thereof. Aluminum is particularly preferable in that the balance among heat dissipation efficiency, price, lightness and processability is favorable. In addition, for improvement of adhesion to the insulative adhesive layer 2b, the surface of the metal-based material 6 facing the insulative adhesive layer 2b is desirably surface-treated, for example, by alumite treatment, degreasing treatment, sand blasting, etching, various types of plating treatment, or primer treatment with a coupling agent.

<Thickness of Metal-Based Material 6>

On the other hand, the thickness of the metal-based material 6 may be varied properly according to the requirements for the metal-base substrate and the metal-based circuit board produced, but preferably 0.15 mm or more, particularly preferably 0.2 mm or more. It is because, when the thickness of the metal-based material 6 is too small, the intermediate product may be wrinkled or folded more easily during handling in production steps, and alternatively when the thickness of the metal-based material 6 is too large, the mass of the board increases excessively.

<Surface Roughness of Metal-Based Material 6>

The surface roughness of the surface of the metal-based material 6 adhering to the insulative adhesive layer 2b is preferably 0.1 to 15 μm as ten-point average roughness (Rz). When the adhesive face has a large surface roughness of more than 15 μm as Rz, the metal-based material may not be bonded to the insulative adhesive layer 2b at sufficient adhesiveness. Alternatively when the adhesive face has a small surface roughness of less than 0.1 μm as Rz, there may be more microvoids generated more easily at the interface with the insulative adhesive layer 2b, possibly leading to decrease in the withstand voltage.

[Insulative Adhesive Layer 2b]

The insulative adhesive layer 2b is formed with an insulative adhesive, for example of an epoxy resin, containing an inorganic filler dispersed therein, which is in the C stage state. The "C stage state" is the state in which the insulative adhesive is insoluble and infusible after almost completion of the reaction among the epoxy resin, the curing agent and the curing catalyst therein. Specifically, the C stage state is the state in which there is almost no heat generation observed when the adhesive is cured under heat in Differential Scanning Calorimeter (DSC) and thus corresponds to the state with a curing rate of 80% or more.

The "curing rate" is the proportion of the exothermic heat during heat curing of the insulative adhesive after heat treatment, as compared to 100 of the exothermic heat during heating curing of its unreacted insulative adhesive, and the exothermic heat can be determined by DSC.

<Thickness of Insulative Adhesive Layer 2b>

The thickness of the insulative adhesive layer 2b in the C stage state is preferably 40 to 250 μm from the viewpoints of withstand voltage and heat dissipation efficiency. It is occasionally difficult to obtain desired withstand voltage when the thickness of the insulative adhesive layer 2b is less than 40 μm, while the insulative adhesive layer 2b may have increased thermal resistance and thus decreased heat dissipation efficiency when the thickness of the insulative adhesive layer 2b is more than 250 μm.

<Thermal Conductivity and Withstand Voltage of Insulative Adhesive Layer 2b>

The thermal conductivity of the insulative adhesive layer 2b in the C stage state is preferably 1.0 W/(m·K) or more, more preferably 2.0 W/(m·K). Alternatively, the withstand voltage of the insulative adhesive layer 2b in the C stage state is preferably 1.0 kV or more, more preferably 2.0 kV or more. It is thus possible to obtain a higher-quality and higher-heat-dissipation metal-based circuit board.

[Conductor Foil 1]

A foil or a clad foil for example of aluminum, iron, copper, stainless steel or an alloy thereof can be used as the conductor foil 1 and in particular, a copper foil is used favorably from the viewpoints of electric conductivity and heat dissipation efficiency. For improvement in adhesiveness to the insulative adhesive layer 2b, the surface of the conductor foil 1 facing the insulative adhesive layer 2b is desirably surface-treated, for example, by degreasing treatment, sand blasting, etching, various types of plating treatment, or primer treatment with a coupling agent.

<Surface Roughness of Conductor Foil 1>

The surface roughness of the surface of the conductor foil 1 adhering to the insulative adhesive layer 2b is preferably 0.1 to 15 μm as ten-point average roughness (Rz). When the surface of the adhesive face is rough, more specifically when the ten-point average roughness (Rz) thereof is more than 15 μm, the conductor foil may not be bonded to the insulative adhesive layer 2b at sufficient adhesiveness. Alternatively when the surface of the adhesive face is dense, more specifically when the surface roughness is less than 0.1 μm, there may be more microvoids generated more easily at the interface with the insulative adhesive layer 2b, possibly leading to decrease in withstand voltage.

<Thickness of Conductor Foil 1>

The thickness of the conductor foil 1 is not particularly limited and may be varied properly according to the requirements for the metal-base substrate and the metal-based circuit board produced, but preferably 0.018 to 0.5 mm, particularly preferably 0.035 to 0.14 mm. When the thickness of the conductor foil 1 is too small, the intermediate product may be wrinkled or folded more easily, causing defects, during its handling in production steps. Alternatively when the thickness of the conductor foil 1 is too large, it may result in decrease of productivity.

Figure 2:
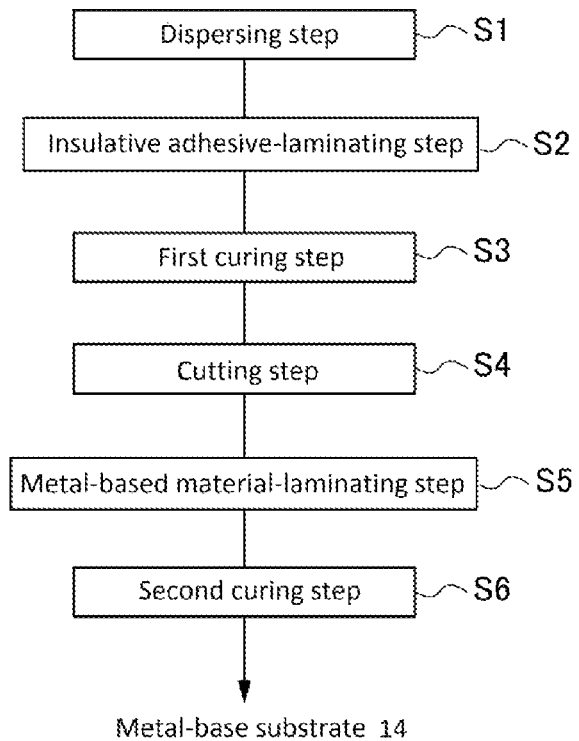
FIG. 2 is a flow chart showing a method of manufacturing the metal-base substrate according to the first embodiment of the present invention.
Figure 3:
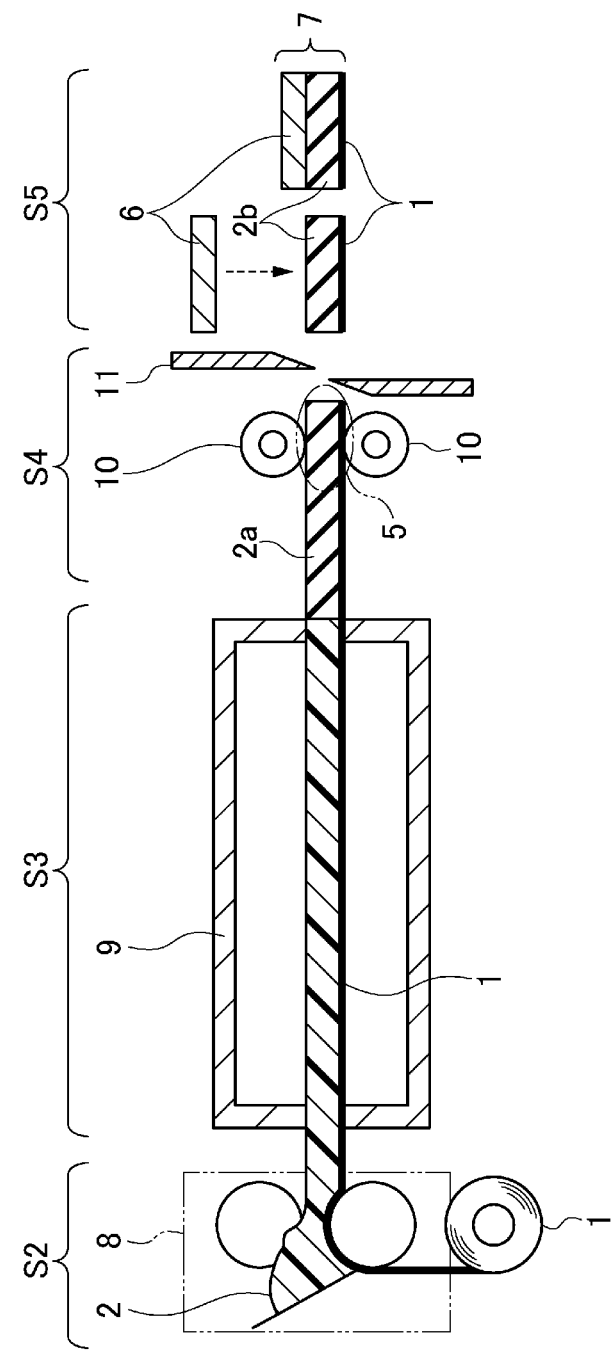
FIG. 3 is a schematic cross-sectional view showing a laminating step S2 to a metal-based material-laminating step S5 in FIG. 2.
Figure 4:
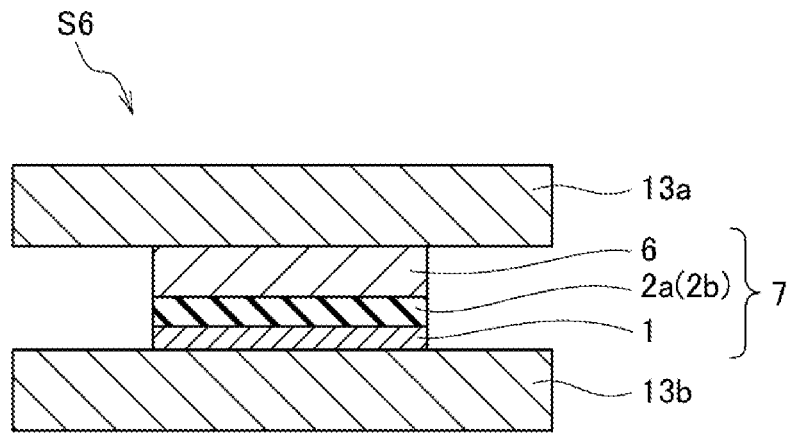
FIG. 4 is a schematic cross-sectional view showing a second curing step S6 in FIG. 2.

Hereinafter, a method of manufacturing a metal-base substrate 14 according to the present embodiment will be described. FIG. 2 is a flow chart showing the method of manufacturing a metal-base substrate in the present embodiment. Also, FIG. 3 is a schematic cross-sectional view showing a laminating step S2 to a metal-based material-laminating step S5, and FIG. 4 is a schematic cross-sectional view showing a second curing step S6.

As shown in FIG. 2, in the method of manufacturing a metal-base substrate 14 in the present embodiment, a step of dispersing components for an insulative adhesive 2 (dispersing step S1), a step of laminating the insulative adhesive 2 on a conductor foil 1 (insulative adhesive-laminating step S2), a step of forming an insulative adhesive layer 2a in the B stage state by heating the insulative adhesive 2 (first curing step S3), a step of cutting the composite 5 of the conductor foil 1 and the insulative adhesive layer 2a into a particular length (cutting step S4), a step of laminating a metal-based material 6 on the insulative adhesive layer 2a (metal-based material-laminating step S5), and a step of converting the insulative adhesive layer 2a in the B stage state to the insulative adhesive layer 2b in the C stage state by heat-pressurization under a particular condition (second curing step S6) are carried out in that order.

[Dispersing Step S1]

The dispersing step S1 is a step of dispersing components for the insulative adhesive 2 uniformly and a wetting dispersant is added to the insulative adhesive 2 for improvement of dispersion state. When the insulative adhesive 2 is divided into a "dispersion medium" and a "disperse phase" and these two phases are described separately, the dispersing step S1 is a step of dispersing the disperse phase uniformly in the dispersion medium, which comprises a step of homogenizing the disperse phase by mechanical force mainly of shearing force and dispersing the disperse phase into the dispersion medium and a step of wetting the surface of the disperse phase with the dispersion medium. In addition, the dispersing step S1 preferably comprises a step of wetting the disperse phase with the dispersion medium and a step of stabilizing the disperse phase in the dispersion medium by preventing reaggregation or sedimentation thereof, specifically a step of preventing reaggregation or sedimentation of the filler.

<Wetting Dispersant>

The wetting dispersant is effective in improving the wetness and stability of the surface of the disperse phase and thus suppressing void generation. The wetting dispersant for use in the present embodiment may be any wetting dispersant if it orients itself on the surface of the disperse phase and assures sufficient wetness and stability of the disperse phase in the dispersion medium, and for example, copolymer compounds having acid or base groups such as amino, amide, aminoamide, phosphoric acid or carboxyl groups as adsorbing groups can be used. In the dispersing step S1, the wetting dispersant is preferably used in combination with a surface-adjusting agent, an antifoaming agent, a silane-coupling agent and others.

<Dispersion Medium>

The "dispersion medium" in the insulative adhesive 2 comprises, for example, an epoxy resin, a curing agent, a curing catalyst, a solvent and others.

Epoxy Resin

The epoxy resin provides electrical properties needed for printed wiring boards for mounting heat-generating electronic parts, adhesiveness to the conductor foil or metal-based material, heat resistance and others. Typical examples thereof include bisphenol A-type epoxy resins, bisphenol F-type epoxy resins, polyfunctional epoxy resins (cresol novolak epoxy resins, dicyclopentadiene-type epoxy resins, for example), cycloaliphatic epoxy resins, glycidyl ester-type epoxy resins, glycidyl amine-type epoxy resins and the like. Bisphenol A- or F-type epoxy resins, which are well-balanced in properties including adhesiveness, heat resistance, electrical properties, flexibility and cost, are preferable among them and in particular, those resins having an epoxy equivalence of 400 or less are more preferable.

For improvement of the storage stability and moldability in the heat pressurization step of the insulative adhesive layer 2a in the B stage state, a high-molecular weight bisphenol A- or F-type epoxy resin may be added to the insulative adhesive 2 in addition to the epoxy resin described above. The epoxy equivalence in such a case is preferably 800 or more.

Curing Catalyst

The curing agent blended into the insulative adhesive 2 is preferably an agent that accelerates self-polymerization reaction of epoxy groups, addition reaction between epoxy groups and active hydrogen compounds and copolycondensation reaction of epoxy groups with acid anhydride groups and controls the reaction-starting temperature at around 60° C. Typical examples thereof include tertiary amines, imidazoles, boron salts of onium compounds and the like.

The "reaction-starting temperature" is the temperature at the intersection between the base line and the tangent line drawn on the infection point of the rising curve in the exothermic curve obtained by heat curing of the insulative adhesive 2 by DSC.

Curing Agent

The epoxy resin may be cured only by using the curing catalyst described above, but a curing agent may also be used additionally. If a curing agent is added to the insulative adhesive 2, it is desirably blended in such an amount that the active hydrogen equivalence (or acid anhydride equivalence) of the curing agent becomes 0.01 to 3.0 with respect to 1 of the epoxy equivalence of the epoxy resin.

Examples of the curing agents constituting the "dispersion medium" include active hydrogen compounds reactive with epoxy groups (compounds having amino, carboxyl, hydroxyl, thiol or other groups), acid anhydride group-containing compounds and the like. In particular, compounds having hydroxyl group and/or carboxyl group, acid anhydrides, or compounds having one, two or more of them, which are all higher in the reaction-starting temperature with epoxy groups, are preferable.

If favorable handleability is provided to the insulative adhesive layer 2a in the B stage state, the curing agent is preferably a compound containing aliphatic rings, aliphatic chains, polyalkylene glycols or the like, which are superior in flexibility, in the main chain. Typical examples thereof include 3-dodecylsuccinic anhydride, aliphatic dibasic acid polyanhydrides and the like.

Solvent

The solvent constituting the "dispersion medium" may be any solvent if it dissolves the epoxy resin and the curing agent and, for example, ethylene glycol monobutylether may be used. The blending rate of the solvent is preferably 10 parts by weight or less with respect to the total amount of the epoxy resin, the curing agent and the inorganic filler. Use of an excessive amount of the solvent may make it difficult to remove microvoids under reduced pressure in the insulative adhesive-laminating step S2 described below.

<Disperse Phase>

The disperse phase is preferably an inorganic filler electrically insulative and superior in thermal conductivity and examples of such inorganic fillers include silica, alumina, aluminum nitride, silicon nitride, boron nitride, magnesium oxide, beryllium oxide and the like.

The inorganic filler is desirably blended in the insulative adhesive 2 in such an amount that the inorganic filler content is 35 to 80 vol % with respect to the total volume of the insulative adhesive layer 2b formed. An inorganic filler content in the insulative adhesive layer 2b at less than 35 vol % makes it difficult to obtain needed thermal conductivity. Alternatively, an inorganic filler content of more than 80 vol % makes the dispersion highly viscous, leading to easier generation of microvoids during preparation of the insulative adhesive layer 2a or 2b and possibly affecting the withstand voltage and the adhesiveness of the layer. Further for prevention of thickening of the dispersion by the inorganic filler and suppression of microvoid generation, two or more inorganic fillers different in particle diameter are desirably added as mixed.

<Apparatus>

The dispersing apparatus for use in the dispersing step S1 may be any apparatus if it gives shearing force sufficient for homogenizing and dispersing the disperse phase into the dispersion medium and, for example, dispersing apparatuses such as bead mills, kneaders, three roll mills, uniaxial kneading extruders, biaxial kneading extruders and planetary stirrers can be used.

In addition, it is preferable, in the method of manufacturing a metal-base substrate in the present embodiment, to further reduce the number of voids by one or more means, for example by treatment under vacuum, ultrasonic wave, centrifugal force, vibration and/or heat, at the end of the dispersing step S1.

[Insulative Adhesive-Laminating Step S2]

As shown in FIG. 3, the insulative adhesive-laminating step S2 is a step of laminating the insulative adhesive 2 prepared in the dispersing step S1 described above on a conductor foil 1 as feeding the roll-shaped conductor foil 1. Suitable means, such as die coater, comma coater, roll coater, bar coater, gravure coater, simultaneous die coater, curtain coater, doctor blade coater, spray coater or screen printer, is applicable as the means for insulative adhesive layer-continuously forming unit 8 used in the insulative adhesive-laminating step S2.

It is also possible, by improving the wetness toward the insulative adhesive 2 of the insulative adhesive-laminating face of the conductor foil 1, to reduce incorporation of voids at the interface between the insulative adhesive 2 and the conductor foil 1 during lamination of the insulative adhesive 2. Examples of the methods of improving the wetness to the insulative adhesive 2 include the following two methods and these methods may be carried out alone or in combination.

(1) Method of improving the wetness to the insulative adhesive 2 by processing the coating face of the roll-shaped conductor foil 1 continuously by plasma treatment, corona treatment or excimer cleaning treatment before lamination of the insulative adhesive 2, (2) Method of improving the wetness to the coating face of the conductor foil 1 by reducing the viscosity of the insulative adhesive 2 by heating the insulative adhesive layer-continuously forming unit 8.

[First Curing Step S3]

As shown in FIG. 3, the first curing step S3 is a step of heating and curing the insulative adhesive 2 laminated on the conductor foil 1 fed continuously into the B stage state and thus forming an insulative adhesive layer 2a. For example, a hot-air furnace, a far-infrared furnace or a furnace in combination thereof can be used as the furnace 9 for heating the insulative adhesive 2.

The "B stage state" is a semi-cured state, in which the reaction among the epoxy resin, the curing agent and the curing catalyst in the insulative adhesive 2 under progress by the heat treatment is terminated before completion. Specifically, it is a state in which the insulative adhesive is solid at normal temperature (25° C.) and fuses again when heated at high temperature (60° C. or higher). Quantitatively, it is a state with a curing rate, as described in the section of curing rate, of 5 to 80%.

It is also possible to improve the productivity during production by adjusting the rate of the reaction in the B stage state. Specifically, it is possible to obtain a tack-free insulative adhesive layer surface in the B stage state by controlling the curing reaction rate to 50 to 70%. If a tack-free surface is obtained, there is no need for use of a protective film, which is desirable from the points of operation and cost.

Further, the reaction-starting temperature of the insulative adhesive layer 2a in the B stage state is desirably 60° C. or higher. When the reaction-starting temperature is lower than 60° C. in this stage, curing reaction progresses between the metal-based material-laminating step S5 and the second curing step S6 described below, depending on the working environment, and the melted insulative adhesive layer 2a in the B stage state cannot wet the surface of the metal-based material 6 sufficiently in the second curing step S6. If so, there are voids and separations generated after curing reaction at the interface between the insulative adhesive layer 2b in the C stage state and the metal-based material 6, leading to deterioration of withstand voltage characteristics and adhesiveness.

[Cutting Step S4]

In the cutting step S4, the composite 5 of the conductor foil 1 and the insulative adhesive layer 2a in the B stage state after the first curing step S3 is cut into a particular length, to give sheet-shaped products. For example, a cutting method for example by using a revolving saw blade, knife blade or shear blade is applicable as the method of the cutting unit 11 for cutting the composite 5. A surface protection film, such as of polyethylene terephthalate or polyethylene, may be formed on the insulative adhesive layer 2a in the B stage state by a nip roll 10 installed upstream of the cutting unit 11.

[Metal-Based Material-Laminating Step S5]

As shown in FIG. 3, a metal-based material 6 is laminated on the insulative adhesive layer 2a, forming a laminate 7 in the metal-based material-laminating step S5.

[Second Curing Step S6]

The second curing step S6 is a step of curing the insulative adhesive layer 2a in the B stage state into the C stage state by heat pressurization of the laminate 7, forming an insulative adhesive layer 2b. The method is not particularly limited, but, as shown in FIG. 4, the laminate 7 is preferably heated under pressure as it is held between a pair of heat pressurization plates 13a and 13b.

<Heat Pressurization Condition>

As for the condition then, the heating temperature is in the range of 70 to 260° C. and the pressure in the range of 0.1 to 10 MPa. It is thus possible to suppress void generation and improve adhesiveness. Also in the second curing step S6, the atmosphere is more preferably reduced to a reduced pressure of about 40 kPa (30 mmHg) or less. It is possible to make the melted insulative adhesive layer 2a in the B stage state wet the surface of the metal-based material 6 sufficiently by treating the laminate 7 both under heat and pressure at the same time. It is also possible to remove the air present at the interface between the surface of the insulative adhesive layer 2a in the B stage state and the metal-based material 6 by placing the laminate 7 under a reduced-pressure atmosphere of about 40 kPa (30 mmHg) or less. As a result, it is possible to obtain a metal-base substrate 14 that has no void at the interface between the insulative adhesive layer 2b in the C stage state and the metal-based material 6 after the curing reaction of the insulative adhesive layer 2a and is thus favorable in the adhesiveness.

As described above in detail, since, in the method of manufacturing a metal-base substrate of the present embodiment, an insulative adhesive containing a wetting dispersant blended and dispersed uniformly therein is laminated on a conductor foil, forming an insulative adhesive layer in the B stage state, a metal-based material is laminated thereon, and the insulative adhesive layer is cured into the C stage state under a particular condition, it is possible to produce a high-quality and high-heat-dissipation metal-base substrate that contains no void remaining in the insulative adhesive layer.

Modified Embodiment of the First Embodiment

Figure 5:
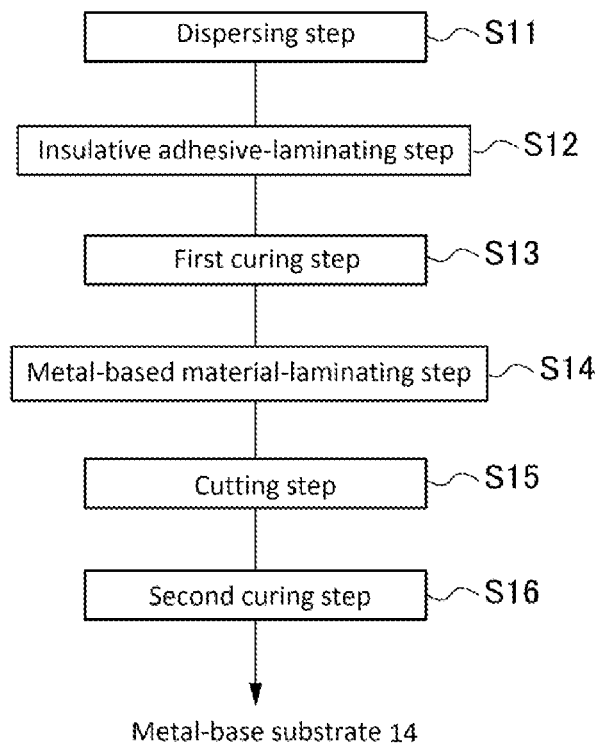
FIG. 5 is a flow chart showing a method of manufacturing a metal-base substrate according to an embodiment modified from the first embodiment of the present invention.
Figure 6:
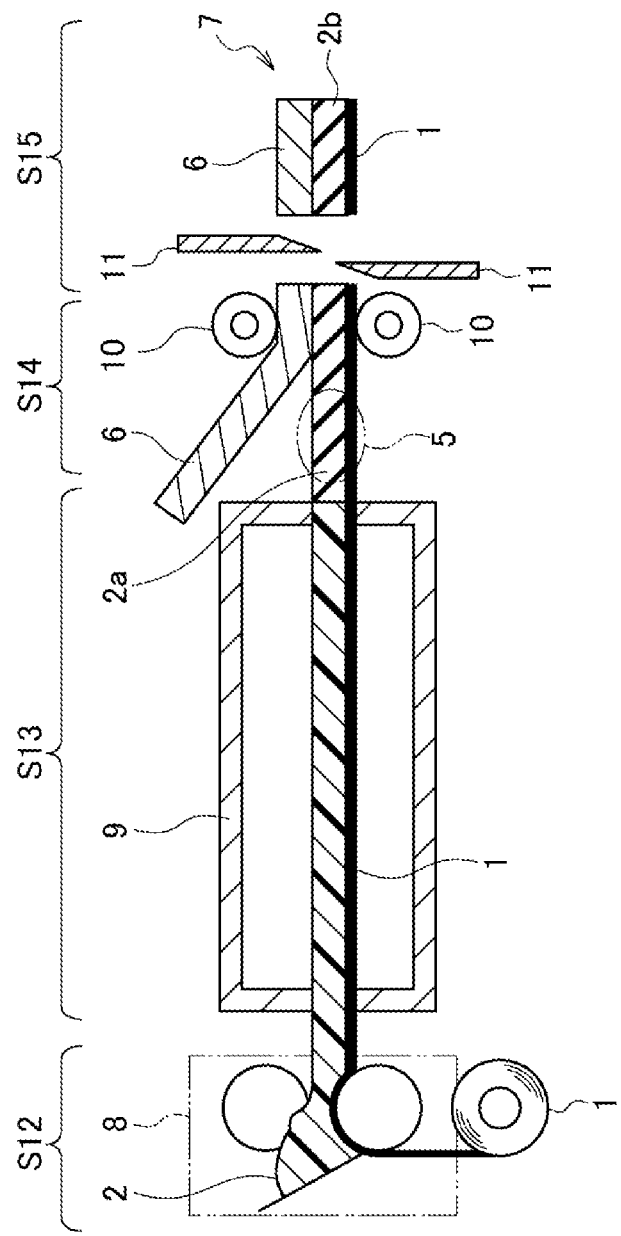
FIG. 6 is a schematic view showing a laminating step S12 to a cutting step S15 in FIG. 5.

In the method of manufacturing a metal-base substrate in the first embodiment described above, a metal-based material-laminating step S5 is performed after the cutting step S4, but the present invention is not limited to the embodiment and the metal-based material 6 may be laminated before cutting. FIG. 5 is a flow chart showing a method of manufacturing a metal-base substrate in an embodiment modified from the first embodiment of the present invention and FIG. 6 is a schematic view illustrating a laminating step S12 to cutting step S15. The same codes are allocated to the parts in FIG. 6, which are identical with those shown in the production method of FIG. 3, and detailed description thereof is omitted.

As shown in FIGS. 5 and 6, in the method of manufacturing a metal-base substrate in the present modified embodiment, a step of dispersing components for an insulative adhesive 2 (dispersing step S11), a step of laminating the insulative adhesive 2 on a conductor foil 1 (insulative adhesive-laminating step S12), a step of forming an insulative adhesive layer 2a in the B stage state by heating the insulative adhesive 2 (first curing step S13), a step of laminating a metal-based material 6 on the insulative adhesive layer 2a (metal-based material-laminating step S14), a step of cutting the composite 5 of the conductor foil 1 and the insulative adhesive layer 2a into a particular length (cutting step S15) and a step of converting the insulative adhesive layer 2a in the B stage state into an insulative adhesive layer 2b in the C stage state by heat pressurization under a particular condition (second curing step S16) are carried out in that order.

Accordingly, it is possible to improve productivity by forming a layer of the metal-based material 6 on the insulative adhesive layer 2a and then cutting the composite. The configuration and advantageous effects other than those described above in the present modified embodiment are the same as those described above in the first embodiment.

Second Embodiment

Figure 7:
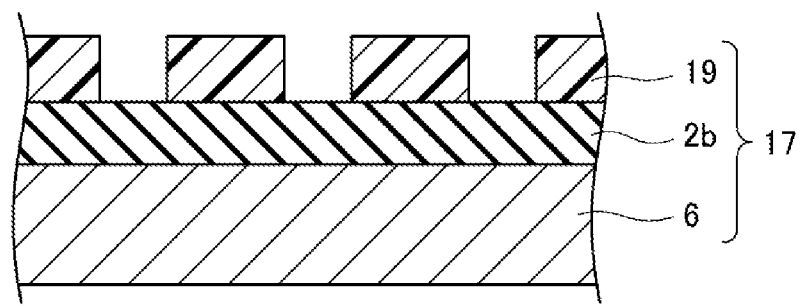
FIG. 7 is a schematic cross-sectional view illustrating the configuration of a metal-based circuit board according to a second embodiment of the present invention.

Hereinafter, a method of manufacturing a metal-based circuit board in a second embodiment of the present invention will be described. FIG. 7 is a schematic cross-sectional view illustrating the configuration of the metal-based circuit board in the present embodiment. As shown in FIG. 7, the metal-based circuit board 17 in the present embodiment is a metal-base substrate 14 produced by the method described above in the first embodiment or its modified embodiment, carrying a conductor pattern (not shown in the Figure) and an organic insulative film 19 formed on the insulative adhesive layer 2b.

Figure 8:
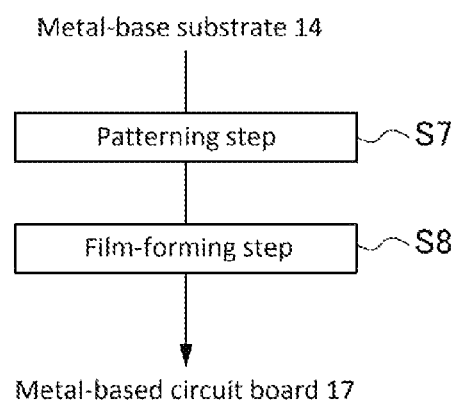
FIG. 8 is a flow chart showing a method of manufacturing metal based circuit board according to the second embodiment of the present invention.

Hereinafter, the method of manufacturing a metal-based circuit board 17 in the second embodiment of the present invention will be described. FIG. 8 is a flow chart showing the method of manufacturing a metal-based circuit board in the present embodiment. As shown in FIG. 8, in the method of manufacturing a metal-based circuit board in the present embodiment, a step of forming a conductor pattern on the conductor foil 1 of the metal-base substrate 14 produced by the method described above in the first embodiment or its modified embodiment (patterning step S7) and a step of forming a film on the pattern (film-forming step S8) are carried out, to produce a metal-based circuit board 17 shown in FIG. 7.

[Patterning Step S7]

In the patterning step S7, an etching resist is first formed on the conductor foil 1 of the metal-base substrate 14 by a screen-printing or photograph-developing method, masking the predetermined positions of the surface of the conductor foil 1. Part of the conductor foil 1 is corroded and dissolved in that state for example with an ferric chloride etchant, a cupric chloride etchant, a hydrogen peroxide/sulfuric acid etchant or an alkaline etchant, and the resulting etching resist is peeled off. In this way, a conductor pattern (not shown in the Figure) is formed on the insulative adhesive layer 2b.

[Film-Forming Step S8]

In the film-forming step S8, an organic insulative film 19 is formed on the insulative adhesive layer 2b and the conductor pattern (not shown in the Figure) for example by a screen-printing or photograph-developing method.

<Organic Insulative Film>

The organic insulative film 19 preferably has openings for connection to electronic parts at particular positions. The material for the organic insulative film 19 is not particularly limited, if it satisfies the requirements for metal-based circuit boards such as protection of the board surface from the solder used during parts mounting. The organic insulative film 19 may contain additionally a white pigment such as titanium oxide or barium sulfate added for improvement of the brightness of the light-emitting parts such as LEDs. Also for improvement of heat dissipation efficiency, an inorganic filler superior in thermal conductivity, such as silica, alumina, aluminum nitride, silicon nitride, boron nitride, magnesium oxide or beryllium oxide, may be added thereto.

As described above in detail, it is possible by the method of manufacturing a metal-based circuit board in the present embodiment to produce a high-quality and high-heat-dissipation metal-based circuit board that contains no void remaining in the insulative adhesive layer 2b, since the metal-base substrate 14 prepared by the method described above in the first embodiment or its modified embodiment is used.

EXAMPLES

Hereinafter, the advantageous effects of the present invention will be described specifically with reference to Examples and Comparative Examples of the present invention. In the present Examples, metal-base substrates and metal-based circuit boards within the scope of the present invention were prepared in Examples 1 to 5 and the properties thereof were evaluated. In addition, metal-base substrates and metal-based circuit boards outside the scope of the present invention were prepared in Comparative Examples 1 and 2 and the properties thereof were evaluated similarly.

Example 1

Dispersing Step S1

A phenolic novolak (HF-4M, produced by Meiwa Plastic Industries, Ltd.) as curing agent was added to a bisphenol A-type epoxy resin (EPICLON-828, produced by Dainippon Ink and Chemicals, Inc.) as an insulative adhesive raw material in the A stage state at an equivalence ratio of 0.9. In addition, coarse crushed particles of silicon oxide having an average particle diameter of 1.2 μm (A-1, produced by Tatsumori Ltd.) and coarse crushed particles of silicon oxide having an average particle diameter of 10 μm (SQ-10, produced by Hayashi-Kasei Co., Ltd.) were combined and blended in the insulative adhesive at a concentration of 59 vol % (weight rate of coarse particles to fine particles: 9:1).

Further, an imidazole-based curing catalyst (2PZ, produced by Shikoku Chemicals Corporation.) was added in an amount of 0.1 wt part with respect to 100 wt parts of the total amount of the epoxy resin, the curing agent and the inorganic filler; a wetting dispersant (Disperlon 1850, produced by Kusumoto Chemicals, Ltd.) was added in an amount of 0.05 wt part; ethylene glycol monobutylether (butyl cellosolve, produced by Sankyo Chemical Co., Ltd.) was added as solvent in an amount of 7 wt parts; 3-(2-aminoethyl)aminopropyltrimethoxysilane (Z-6020, produced by Dow Corning Toray Co., Ltd.) was added as silane-coupling agent in an amount of 2 wt parts. These components were dispersed uniformly, to give an insulative adhesive 2.

Laminating Step S2

A copper foil (width: 500 mm and thickness: 70 μm) was used as the roll-shaped conductor foil 14, and the insulative adhesive 2 in the A stage state was formed continuously on the copper foil in the size of width: 480 mm and thickness: 100 μm in a doctor blade coater, as the copper foil was fed continuously therein.

First Curing Step S3 to Cutting Step S4

Subsequently, the insulative adhesive 2 was cured continuously into the B stage state in a heat-curing furnace 9, forming an insulative adhesive layer 2a. The composite 5 between the copper foil and the insulative adhesive layer 2a in the B stage state was then cut into sheet-shaped articles of width: 500 mm and length: 500 mm. The reaction-starting temperature of the insulative adhesive layer 2a in the B stage state then was 95° C. and the curing rate was 64%.

Metal-Based Material-Laminating Step S5 to Second Curing Step S6

A degreased aluminum plate (thickness: 1.0 mm/width: 500 mm/length: 500 mm) was laminated as metal-based material 6 on the composite 5 between the conductor foil (copper foil) 1 and the insulative adhesive layer 2a in the B stage state, which was cut into a sheet-shaped article. The composite was then heat-pressurized at 190° C./3 MPa for 3 hours under a reduced pressure of 25 mmHg, to give a metal-base substrate of Example 1.

Patterning Step S7

An etching resist was formed by screen printing on the conductor foil (copper foil) 1 of the metal-based circuit board of Example 1 prepared by the method described above and then, the conductor foil was corroded and dissolved with a ferric chloride etchant and the etching resist was separated with an aqueous alkaline solution, forming a conductor pattern.

Film-Forming Step S8

An organic insulative film 19 was formed by photographic developing method and the composite was processed into a desired size (10 mm×460 mm) with a mold, to give a metal-based circuit board of Example 1.

Example 2

A metal-base substrate and a metal-based circuit board of Example 2 were prepared in a manner and under a condition similar to those in Example 1, except that an aluminum plate (thickness: 1.0 mm/width: 500 mm/length: 500 mm) was laminated as metal-based material 6 before the composite 5 between the conductor foil (copper foil) 1 and the insulative adhesive layer 2a in the B stage state was cut into sheet-shaped articles.

Example 3

A metal-base substrate and a metal-based circuit board of Example 3 were prepared in a manner and under a condition similar to those in Example 1, except that the heat pressurization was preformed at atmospheric pressure (760 mmHg) and at 190° C./3 MPa for 3 hours in the second curing step S6.

Example 4

A metal-base substrate and a metal-based circuit board of Example 4 were prepared in a manner and under a condition similar to those in Example 1, except that a phenoxy resin (FX316, produced by Tohto Kasei Co., Ltd.) was added to the insulative adhesive 2 in an amount of 70 parts by mass with respect to 100 parts by mass of a bisphenol A-type epoxy resin (EPICLON-828, produced by Dainippon Ink and Chemicals, Inc.). The reaction-starting temperature of the insulative adhesive layer 2a in the B stage state then was 110° C. and the reaction rate was 63%.

Example 5

A metal-base substrate and a metal-based circuit board of Example 5 were prepared in a manner and under a condition similar to those in Example 1, except that 3-dodecylsuccinic anhydride was added to the insulative adhesive 2 in an amount of 40 parts by mass with respect to 100 parts by mass of a phenolic novolak (HF-4M, produced by Meiwa Plastic Industries, Ltd.). The reaction-starting temperature of the insulative adhesive layer 2a in the B stage state then was 90° C. and the reaction rate was 64%.

Comparative Example 1

A metal-base substrate and a metal-based circuit board of Comparative Example 1 were prepared in a manner and under a condition similar to those in Example 1, except that the curing rate of the insulative adhesive 2 on the conductor foil (copper foil) 1 was 3% after it was cured in the heat-curing furnace 9 in the first curing step S3.

Comparative Example 2

A metal-base substrate and a metal-based circuit board of Comparative Example 2 were prepared in a manner and under a condition similar to those in Example 1, except that the curing rate of the insulative adhesive 2 on the conductor foil (copper foil) 1 was 83% after it was cured in the heat-curing furnace 9 in the first curing step S3.

Subsequently, properties of the metal-base substrates and the metal-based circuit boards of Examples 1 to 5 and Comparative Examples 1 and 2, which were prepared by the methods described above, were evaluated by the methods below.

<Withstand Voltage>

A voltage of 0.50 kV was first applied between the conductor foil and the metal-based material in each of the metal-base substrates of Examples and Comparative Examples and the voltage was then raised by 0.20 kV every 20 seconds and the maximum voltage at which the insulative adhesive layer remained resistant to dielectric breakdown was determined.

<Copper Foil Peel Strength>

The minimum value of the load needed for separation of a conductor foil with a width of 10 mm formed on each of the metal-base substrates of Examples and Comparative Examples when the foil was peeled off at 50 mm/minute for a distance of 50 mm was determined.

<Thermal Conductivity>

The metal-based material 6 and the conductor foil 1 were removed from each of the metal-base substrates of Examples and Comparative Examples by corrosive solubilization and the insulative adhesive layer was separated. The thermal conductivity of the insulative adhesive layer was then determined by xenon flash method (LFA 447 Nanoflash, produced by NETZSCH).

<Void Rate>

The void rate was calculated according to Formula 1 below. Specifically, the metal-based material 6 and the conductor foil 1 were removed from each of the metal-base substrates of Examples and Comparative Examples by corrosive solubilization and the insulative adhesive layer was separated. The insulative adhesive layer in the C stage state was then cut into pieces of 1 cm square; the surface was observed under optical microscope (×100); the void volume was determined from the number and the diameters of voids; and the void rate was calculated according to the following Formula 1.

Void rate (%)=(Volume of voids/Volume of insulative adhesive layer in C stage state)×100  [Formula 1]

<Maximum Temperature>

A solder paste was printed by screen printing on the area for mounting electronic parts in a conductor pattern of each of the metal-based circuit boards of Examples and Comparative Examples and a LED (NESW425C, produced by Nichia Corporation) was mounted thereon and subjected to reflow heating. The maximum temperatures of the LED and the circuit board when voltage was applied to the metal-based circuit board carrying the LED mounted thereon were determined. The temperatures of the LED and the circuit board were determined by infrared thermography (FLIR SC600, available from Yamatake & Co., Ltd.).

The results above are summarized in the following Table 1.

TABLE 1

|  | Example | | | | | Comparative Example | |
|---|---|---|---|---|---|---|---|
|  | 1 | 2 | 3 | 4 | 5 | 1 | 2 |
| Withstand voltage (kV) | 8.2 | 8.4 | 7.9 | 6.5 | 7 | 0.5 | 1.2 |
| Copper foil peel strength (kN/m) | 1.7 | 1.7 | 1.6 | 1.9 | 1.5 | 1.3 | 1.4 |
| Thermal conductivity (W/(m·K)) | 2.1 | 2.1 | 2 | 2.1 | 2.1 | 0.6 | 0.8 |
| Void rate (%) | 0 | 0 | 0.01 | 0 | 0 | 1.5 | 1.3 |
| Maximum temperature (° C.) | 55 | 56 | 57 | 54 | 55 | 74 | 73 |

As shown in Table 1 above, the metal-base substrate of Comparative Example 1 that had an insulative adhesive layer not converted into the B stage state after the first curing step and the metal-base substrate of Comparative Example 2 that had an insulative adhesive layer converted into the C stage state after the first curing step had a high void rate of 1.2% or more. In addition, the metal-base substrates of Comparative Examples 1 and 2 were lower in withstand voltage and thermal conductivity and also insufficient in heat dissipation efficiency.

In contrast, the metal-base substrates and metal-based circuit boards of Examples 1 to 5 showed favorable values both in withstand voltage and copper foil peel strength. In addition, the void rates, which show the percentages of voids, were 0.01% or less; the maximum temperatures were lower; and the heat dissipation efficiencies were favorable.

The results above confirm that it is possible according to the present invention to produce a high-quality and high-heat-dissipation metal-base substrate and a high-quality and high-heat-dissipation metal-based circuit board that contain no void remaining in the insulative adhesive layer.

REFERENCE SIGNS LIST

1: Conductor foil
2: Insulative adhesive
2a: Insulative adhesive layer in the B stage state
2b: Insulative adhesive layer in the C stage state
5: Composite
6: Metal-based material
7: Laminate
8: Continuously insulative adhesive layer-forming unit
9: Furnace
10: Nip roll
11: Cutting unit
13a, 13b: Heat pressurization plates
14: Board
17: Metal-based circuit board
19: Organic insulative film
S1, S11: Dispersing step
S2, S12: Insulative adhesive-laminating step
S3, S13: First curing step
S4, S15: Cutting step
S5, S14: Metal-based material-laminating step
S6, S16: Second curing step
S7: Patterning step
S8: Film-forming step

The invention claimed is:

1. A method of manufacturing a metal-base substrate having an insulative adhesive layer and a conductor foil laminated in that order on a metal-based material, comprising:
a dispersing step of dispersing a disperse phase in an insulative adhesive-dispersing medium that contains a wetting dispersant and constitutes the insulative adhesive layer, wherein the insulative-adhesive dispersing medium comprises an epoxy resin, a curing catalyst, and a solvent, wherein the solvent is present at 10 parts by weight or less, based on the total amount of the insulative-adhesive dispersing medium;

a laminating step of laminating the insulative adhesive on the conductor foil as feeding the roll-shaped conductor foil;

a first curing step of curing the insulative adhesive on the conductor foil under heat into a B stage state and thus forming a composite of the conductor foil and the insulative adhesive layer in the B stage state;

a metal-based material-laminating step of laminating the metal-based material on the insulative adhesive layer in the B stage state to give a laminate; and a second curing step of curing the insulative adhesive layer in the B stage state into the C stage state by heat pressurization of the laminate under the condition of 70 to 260° C. and 0.1 to 10 MPa.

2. The method of manufacturing a metal-base substrate according to claim 1, further comprising a sheet-cutting step of cutting the composite after the first curing step or the laminate after the metal-based material-laminating step into sheet-shaped articles.

3. The method of manufacturing a metal-base substrate according to claim 1, wherein the disperse phase comprise an inorganic filler and further wherein the insulative adhesive comprises from 35 to 80 vol. % of the inorganic filler.

4. The method of manufacturing a metal-base substrate according to claim 1, wherein the insulative adhesive layer in the B stage state in the composite obtained in the first curing step has a reaction-starting temperature of 60 to 250° C.

5. The method of manufacturing a metal-base substrate according to claim 1, wherein the insulative adhesive layer in the C stage state in the laminate obtained in the second curing step has a thermal conductivity of 1.0 to 15.0 W/(m·K).

6. A method of manufacturing a metal-based circuit board, comprising:

a patterning step of forming a conductor pattern on the conductor foil of the board produced by the method of manufacturing a metal-base substrate according to claim 1; and a film-forming step of forming an organic insulative film on the conductor pattern.

7. The method of manufacturing a metal-base substrate according to claim 1, wherein the insulative adhesive layer in the C stage state in the laminate obtained in the second curing step has a thermal conductivity of 2.0 W/(m·K) or more.

8. The method of manufacturing a metal-base substrate according to claim 1, wherein the insulative adhesive layer in the B stage state in the composite obtained in the first curing step has a reaction-starting temperature of 60° C. or higher.

9. The method of manufacturing a metal-base substrate according to claim 1, wherein the insulative adhesive layer in the C stage state in the laminate obtained in the second curing step has a thickness from 40 to 250 µm.

10. The method of manufacturing a metal-base substrate according to claim 1, wherein the curing reaction rate of the insulative adhesive layer is from 50 to 70%.

* * * * *